United States Patent [19]

Negishi

[11] Patent Number: 4,761,659
[45] Date of Patent: Aug. 2, 1988

[54] TEMPERATURE AND AGING COMPENSATED DRIVE CIRCUIT IN A SEMICONDUCTOR LASER BEAM PRINTER

[75] Inventor: Kiyoshi Negishi, Tokyo, Japan

[73] Assignee: Asahi Kogaku Kogyo Kabushiki Kaisha, Tokyo, Japan

[21] Appl. No.: 878,914

[22] Filed: Jun. 26, 1986

[30] Foreign Application Priority Data

Jul. 2, 1985 [JP] Japan ............................ 60-101563[U]

[51] Int. Cl.⁴ .............................................. G01D 9/42
[52] U.S. Cl. .................................. 346/108; 346/76 L; 358/296
[58] Field of Search ................ 346/76 L, 108; 372/29, 372/31, 32, 34, 38

[56] References Cited

U.S. PATENT DOCUMENTS 4,484,331 11/1984 Miller ................................ 372/29 X
4,612,555 9/1986 Hongon et al. ................ 346/108 X
4,612,671 9/1986 Giles ................................. 372/38 X
4,625,315 11/1986 Lemberger et al. ............. 372/31 X

FOREIGN PATENT DOCUMENTS 32145 2/1985 Japan ..................................... 372/38

Primary Examiner—E. A. Goldberg
Assistant Examiner—Huan H. Tran
Attorney, Agent, or Firm—Sughrue, Mion, Zinn, Macpeak & Seas

[57] ABSTRACT

A drive circuit for a semiconductor laser in a laser printer in which the laser output is sampled and compared with a reference signal. The reference signal is varied to compensate for temperature changes of the entire drive circuit, especially the semiconductor laser. The comparison signal then controls the size of the drive current to the laser. This drive current is modulated by the image data.

8 Claims, 4 Drawing Sheets

FIG. 5(a) HC
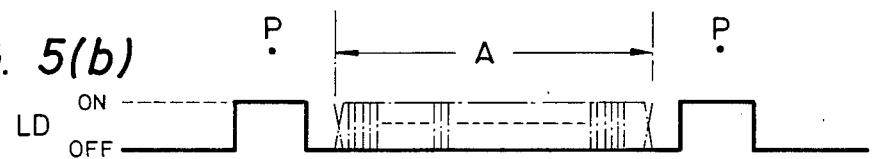
FIG. 5(b) LD
FIG. 5(c) SH
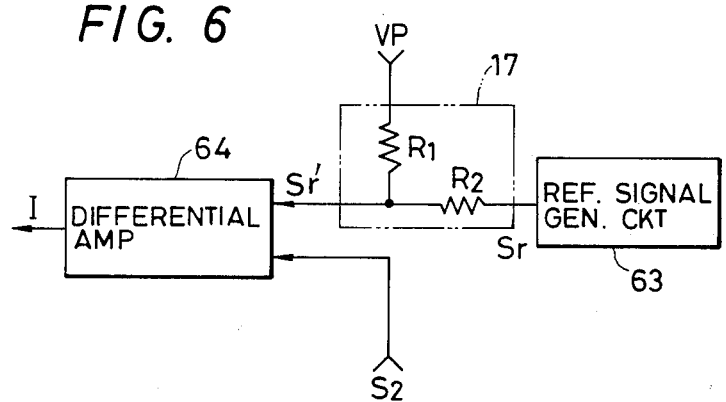
FIG. 6
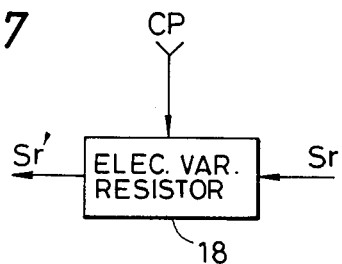
FIG. 7

TEMPERATURE AND AGING COMPENSATED DRIVE CIRCUIT IN A SEMICONDUCTOR LASER BEAM PRINTER

BACKGROUND

1. Field of the Invention

This invention relates generally to a semiconductor laser drive circuit in a laser beam printer. More particularly, it relates to a semiconductor laser drive circuit which can stably output a laser beam and has a considerably simplified construction.

2. Background Art

Recently, a so-called "laser beam printer" has been extensively used in which an electrostatic latent image is formed on a photo-sensitive material by scanning the photo-sensitive material with the laser beam. The laser beam is modulated according to the image data of figures, characters or the like, and the latent image thus formed is subjected to a copying operation including a developing step, a transferring step and a fixing step to obtain a hard copy of the image data. Especially popular has been a small inexpensive laser beam printer using a semiconductor laser.

On the other hand, there has arisen a strong demand for a semiconductor laser drive circuit for a laser beam printer using a semiconductor laser, such as a laser diode, which can compensate for changes of the output (the laser beam) of the semiconductor laser due to its temperature variation and its aging. Such compensation prevents the semiconductor laser from damage, for instance, due to overcurrent, and eliminates erroneous modulation. However, to be practical, such a drive circuit must have a low manufacturing cost. Unfortunately, semiconductor laser drive circuits which can fully satisfy these differing requirements have scarcely been proposed in the art.

SUMMARY OF THE INVENTION

In view of the foregoing, an object of this invention is to simultaneously satisfy all of the abovedescribed requirements.

In particular, an object of the invention is to provide an inexpensive drive circuit for a semiconductor laser printer which can compensate for thermal and aging effects in the laser and the rest of the circuit.

The invention can be summarized as a semiconductor laser drive circuit for a laser beam printer which includes a semiconductor laser for outputting a laser beam. A reference signal generating circuit having a temperature compensating element compensates for the temperature characteristic of the drive circuit including the semiconductor laser and it outputs a reference signal which is corrected by the temperature compensating element. A light receiving element receives a part of a laser beam outputted by the semiconductor laser and outputs a light reception signal according to the result of the light reception. A sample and hold circuit samples the light reception signal outputted by the light receiving element for every main scanning operation, and holds it for the respective main scanning operation. A differential amplifier circuit applies a corrected drive current to the semiconductor laser according to the difference between the light reception signal held by the sample and hold circuit and the reference signal outputted by the reference signal generating circuit. Finally, a switching element is connected in series to signal lines extended from the differential amplifier circuit and the semiconductor laser. The switching element is turned on and off by a modulation signal formed according to the image data, to intermittently permit the application of the corrected drive current to the semiconductor laser.

BRIEF DESCRIPTION OF THE DRAWINGS

FIG. 5 is a timing chart for a description of the operation of the emiconductor laser drive circuit.

FIGS. 6 and 7 are block diagrams showing modifications of the circuit of FIG. 2 or 3.

DETAILED DESCRIPTION OF THE PREFERRED EMBODIMENTS

Figure 1:
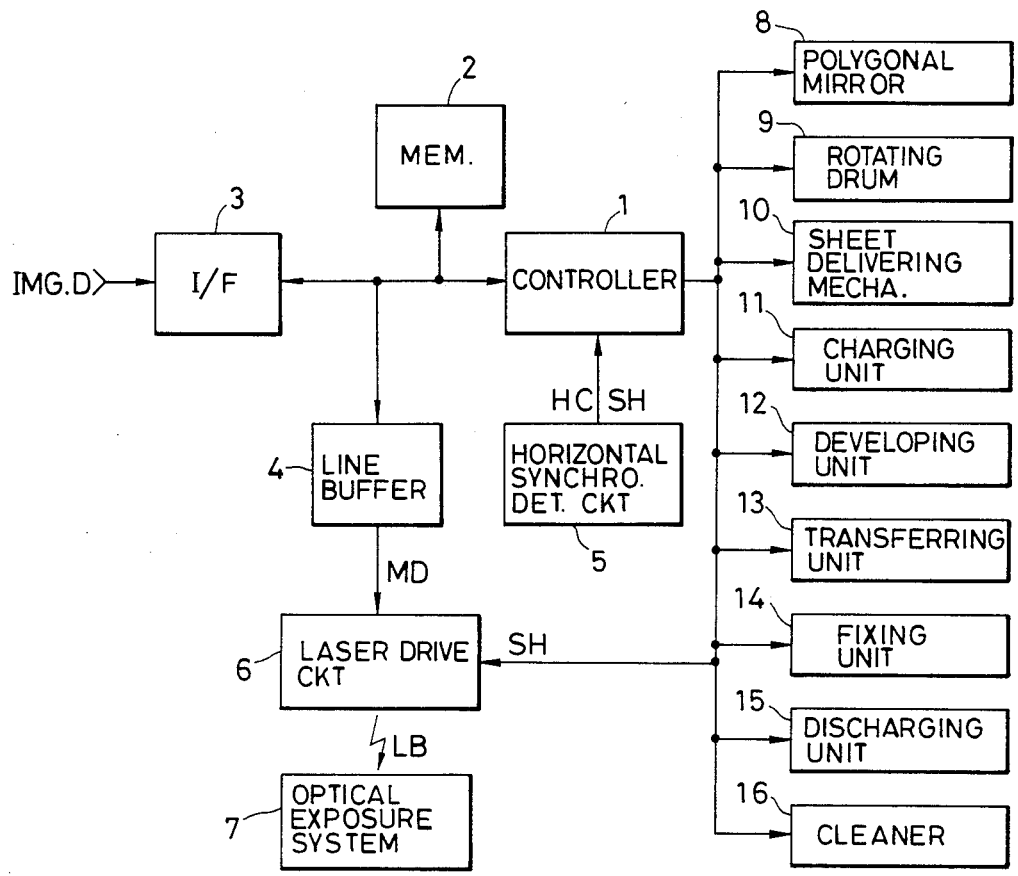
FIG. 1 is a block diagram outlining the arrangement of a laser beam printer having a semiconductor laser drive circuit according to this invention.

One embodiment of this invention will be described with reference to the accompanying drawings. FIG. 1 is a block diagram outlining the arrangement of a laser beam printer which has a semiconductor laser drive circuit according to the invention.

The laser beam printer of the invention comprises a controller 1, a memory 2, an interface (I/F) 3, a line buffer 4, a horizontal synchronizing detecting circuit 5, a semiconductor laser drive circuit 6, an optical exposure system (main scanning system) 7, a rotary polygonal mirror 8 coupled to a drive motor, a photosensitive drum rotating mechanism 9, a sheet delivering mechanism 10, a charging unit 11, a developing unit 12, a transferring unit 13, a fixing unit 14, a discharging unit 15 and a cleaner 16.

The controller 1 controls various circuit elements, i.e., all the elements from the semiconductor laser drive circuit 6 through the cleaner 16, in synchronization with given timing clock pulses while executing a control program stored in advance in the memory 2. The controller 1, executing the control program, sequentially causes a charging operation, an exposing operation (forming a latent image by scanning with a modulated laser beam according to image data), a developing operation, a transferring operation (including a sheet supplying operation), a fixing operation (including a sheet removing operation), a discharging operation, and a cleaning operation.

In addition to the aforementioned control program, image data (IMG D) for figures, characters, or the like which are inputted through the interface 3 are stored in the memory 2.

Modulation data, based on the image data formed by the controller 1, is outputted, as a modulation signal MD, by the line buffer 4.

Figure 4:
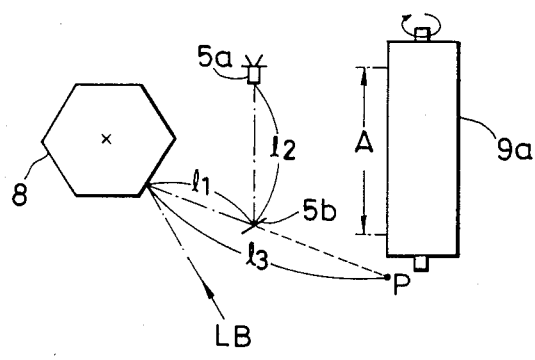
FIG. 4 is a diagram for a description of a horizontal synchronizing detecting circuit 5 in FIG. 1.

The horizontal synchronizing detecting circuit 5 forms a modulation starting horizontal synchronizing signal HC (signal (a) of FIG. 5) and a control signal SH (signal (c) of FIG. 5) for a sample and hold circuit 62 (described later) according to the output of an optical detector 5a (such as a high-speed PIN photo diode). The horizontal synchronizing detecting circuit 5 applies these signals to the controller 1. As shown in FIG. 4, a synchronizing optical detector 5a is disposed at a position on the path of a laser beam reflected from the motor-driven polygonal mirror 8 and a side mirror 5b. The position is determined corresponding to a point P outside a printing region A of a photo-sensitive drum 9a, so that $l_1+l_2=l_3$ is satisfied. In practice, this relation is established through an image-forming lens ($f-\theta$ lens) not shown. The side mirror 5b thus does not interfere with the scanning of the printing region but being in a fixed physical position thereto is used in the establishment of horizontal synchronization.

Figure 2:
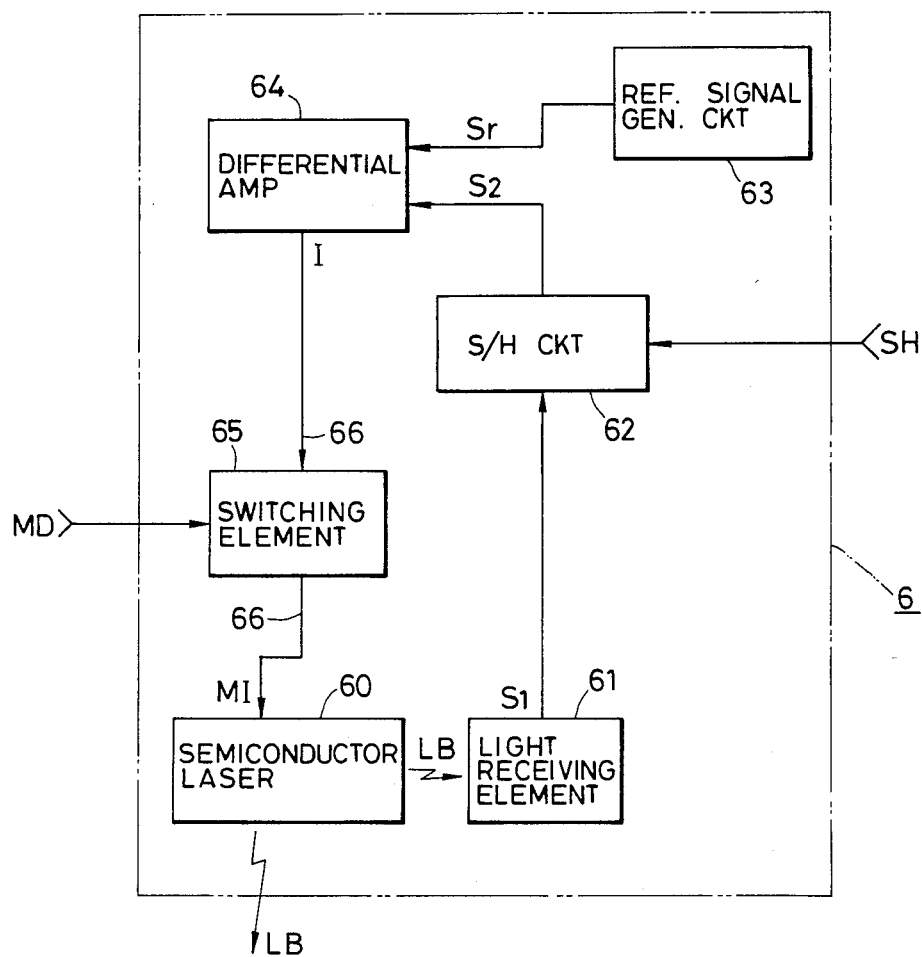
FIG. 2 is a block diagram showing the arrangement of the semiconductor laser drive circuit shown in FIG. 1.

The semiconductor laser drive circuit 6, as shown in FIG. 2, comprises a semiconductor laser 60, a light receiving element 61, the previously mentioned sample and hold circuit 62, a reference signal generating circuit 63, a differential amplifier circuit 64, and a switching element 65.

The semiconductor laser 60 is adapted to output a laser beam LB from each of two opposed ends. The light receiving element 61 receives a part of the laser beam LB outputted by the semiconductor laser 60, and outputs a light reception signal $S_1$ according to the intensity the received light.

The sample and hold circuit 62 samples the light reception signals $S_1$ for every main scanning operation according to the output control signal SH of the horizontal synchronizing detecting circuit 5 which is applied to the sample and hold circuit 62 within the controller 1, as shown in FIG. 1, and holds it for the duration of the main scanning operation.

The reference signal generating circuit 63 has a temperature compensating element (described later) adapted to compensate for the temperature characteristic of the semiconductor laser drive circuit 6 including the semiconductor laser 60, and outputs a reference signal Sr which has been corrected by the temperature compensating element.

The differential amplifier circuit 64 outputs a drive current I according to the difference between the light reception signal $S_2$ held by the sample and hold circuit 62 and the reference signal Sr outputted by the reference signal generating circuit 63.

The switching element 65 switches the signal line 66 extending between the differential amplifier circuit 64 and the semiconductor laser 60. The switching element 65 is turned on and off by the modulation signal MD provided by the line buffer 4, to intermittently transmit the drive current I from the differential amplifier circuit 64. The drive current thus transmitted is applied, as a modulation drive current MI, to the semiconductor laser 60.

Figure 3:
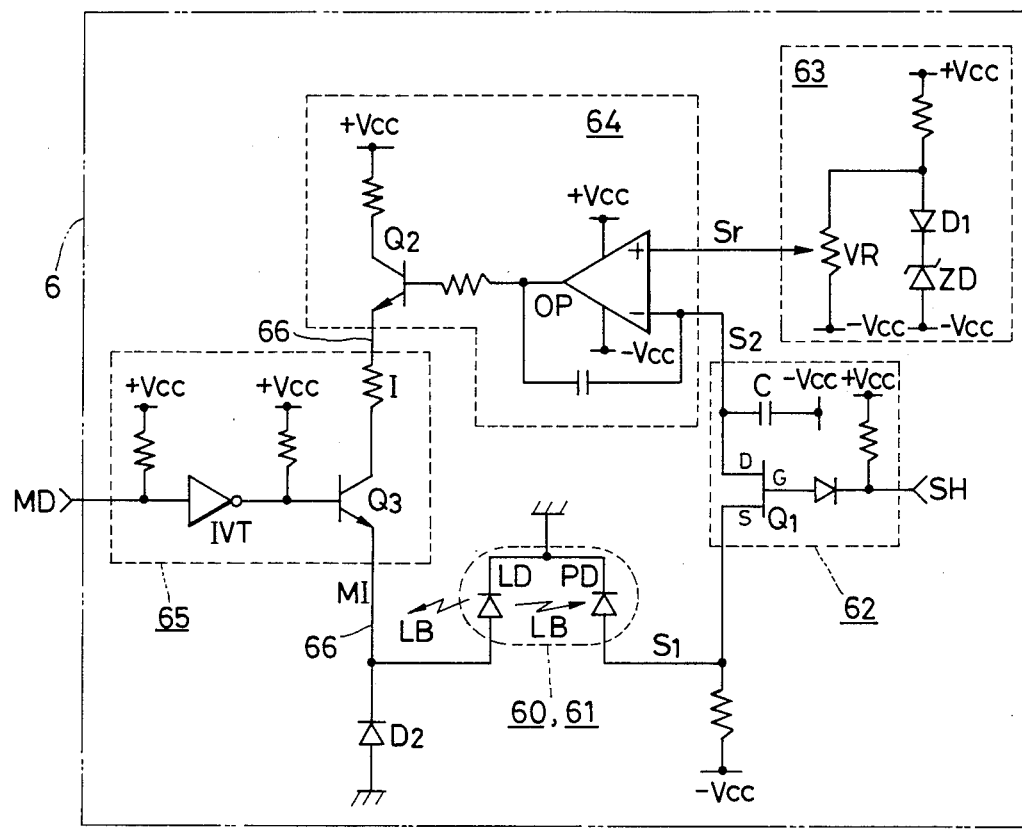
FIG. 3 is a circuit diagram showing in detail the circuit elements of the semiconductor laser drive circuit 6 of FIG. 2.

The circuit elements of the semiconductor laser drive circuit 6 of FIG. 2 will be described in detail with reference to FIG. 3.

The semiconductor laser 60 and the light receiving element 61 comprise a laser diode LD and a PIN photo diode PD built therein. The cathodes of the two diodes LD and PD are grounded. The anode of the laser diode LD is connected to the emitter of a transistor $Q_3$ (described later), while the anode of the PIN photo diode PD is connected through a resistor to a negative power source $-Vcc$.

The sample and hold circuit 62 is made up of a field-effect transistor $Q_1$ capacitor C. The source S of the transistor $Q_1$ is connected to the anode of the PIN photo diode PD, the drain D is connected to the inverted input terminal ($-$) of an operational amplifier OP (described later), and the gate G receives the control signal SH from the controller 1 (FIG. 1). The capacitor C is connected between the drain D of the field-effect transistor $Q_1$ the negative power source $-Vcc$.

The reference signal generating circuit 63 comprises: a variable resistor VR; a temperature compensating diode $D_1$; and a reference voltage generating Zener diode ZD. The variable resistor VR has one power source connecting terminal connected through a fixed resistor to a positive power source $+Vcc$, the other power source connecting terminal connected to the negative power source $-Vcc$, and a variable output terminal connected to the non-inverted input terminal ($+$) of the operational amplifier OP (to be described later).

The cathode of the temperature compensating diode $D_1$ is connected to the cathode of the reference voltage generating Zener diode ZD. The anode of the Zener diode ZD is connected to the negative power source $-Vcc$. The anode of the temperature compensating diode $D_1$ is connected to the negative power supply $-Vcc$ through the variable resistor VR and to the positive power supply $+Vcc$ through a fixed resistor.

The temperature compensating diode $D_1$ should have a temperature characteristic which can substantially compensate the temperature characteristic of the semiconductor laser drive circuit 6 including the laser diode LD. An example of such a temperature compensating diode is a silicon Zener diode, for instance, part type HZ7 produced by and available from Hitachi, Ltd.

The differential amplifier circuit 64 comprises the previously mentioned operational amplifier OP and an NPN transistor $Q_2$. The input terminals of the operational amplifier circuit OP are connected as described above, and its output terminal is connected through a resistor to the base of the transitor $Q_2$.

The collector of the transistor $Q_2$ is connected through a resistor to the positive power source $+Vcc$ and its emitter is connected through a resistor to the collector of a transistor $Q_3$ (to be described later).

The switching element 65 comprises the previously mentioned transistor $Q_3$ and an inverter (driver) IVT. The modulation signal MD from the line buffer 4 (FIG. 1) is supplied to the input terminal of the inverter IVT, the output terminal of which is connected to the base of the transistor $Q_3$. Both the input and output of the inverter IVT are connected to the positive power supply $+Vcc$ through respective pull-up resistors.

As was described before, the collector of the transistor $Q_3$ is connected to the emitter of the transistor $Q_2$, and the emitter of the transistor $Q_3$ is connected to the anode of the laser diode LD.

The diode $D_2$ is used to absorb any surges of the laser diode LD. The cathode of the diode $D_2$ is connected to the connecting point of the emitter of the transistor $Q_3$ and the anode of the laser diode LD and the anode of the diode $D_2$ is grounded.

The operation of the embodiment thus organized will now be described with respect mainly to the semiconductor laser drive circuit 6 of FIG. 3.

The controller 1 of FIG. 1, when started, performs initial processing operations as required and applies the control signal SH to the gate of the fieldeffect transistor $Q_1$ in the sample and hold circuit 62 with predetermined timing while gradually increasing the output of the laser diode LD with the aid of an initializing circuit (not shown).

As a result, the light reception signal $S_1$ ($Sr > S_1$) of the PIN photo diode PD, which corresponds to the output of the laser diode LD and which is gated by the transistor $Q_1$ after application of the control signal SH, is integrated as a charge signal in the capacitor C.

Next, the controller 1 controls the abovedescribed copying operations. In this case, in synchronization with the control of rotation of the photosensitive drum, the line buffer 4 outputs the modulation signal MD according to the image data in the following manner.

In order to apply the other part of the laser beam LB to the above-described optical detector 5a (FIG. 4), a pulse signal for activating the laser diode LD is outputted at a predetermined point in every main scanning operation. This point is located outside the point P which is outside the printing region A, as shown for signal (b) of FIG. 5. This pulse signal is synchronized with the timing for the printing region A which is based on the horizontal synchronizing signal HC (shown by signal (a) of FIG. 5) which is obtained by the application of the laser beam on the synchronizing detector 5a. The modulation signal MD is outputted for every main scanning operation during a scanning operation.

On the other hand, the control signals SH (signal (c) of FIG. 5) are synchronous with the horizontal synchronizing signals HC (the part signal (c) of FIG. 5) and are successively applied to control the sample and hold circuit 62. Therefore, generally the semiconductor laser drive circuit 6 operates as follows.

When the predetermined light reception signal $S_2$ is held by the capacitor C in the sample and hold circuit 62 during the initial operation, the differential amplifier circuit 64 becomes ready for outputting the drive current I according to the difference between the reference signal Sr and the held signal $S_2$. Since the laser beam output was gradually increased during initialization, Sr is greater than $S_2$. In subsequent scans, the delayed feedback causes the signal $S_1$ and thus the intensity of the laser beam LB to conform to values set by the reference signal Sr.

Therefore, when the line buffer 4 (FIG. 1) outputs the modulation signal MD including the pulse signal which turns on and off the laser diode LD as shown by signal (b) of FIG. 5. The previously mentioned drive current I (outputted according to the difference between the signals Sr and $S_2$), is turned on and off or modulated by the transistor $Q_3$ and is then applied, as a modulation drive current MI, to the laser diode LD, whereby the laser beam LB output is modulated. Thus, formation of a latent image by one main scanning operation (exposure) is achieved.

While a latent image is being formed by repeatedly carrying out the above-described operation for every main scanning operation in synchronization with the rotation of the photo-sensitive drum, the control signal SH is supplied to the sample and hold circuit 62 for every main scanning operation. Therefore, the light reception signal $S_1$ fed back to control the output of the laser diode LD is clamped to the value at all times which is provided before the start of the current print line. Accordingly, a function of automatic power control (APC) utilizing the feedback of the light reception signal $S_1$ (i.e., maintaining the laser beam output constant) can Prevent the difficulty that the modulation of the laser beam LB causes application of overcurrent to the laser diode LD while compensating the control error or the secular change of the laser diode LD.

As the ambient temperature of the laser diode LD changes, the output of the laser diode LD tends to change. However, in response to the change the reference signal Sr is corrected by the temperature characteristic of the temperature compensating diode $D_1$, and therefore the drive current I changes to maintain the laser beam output constant.

Accordingly, even if the ambient temperature changes, the laser beam output is maintained unchanged, and therefore the resultant prints are not affected in quality.

In addition to the above-described effect, the following effects are provided by the invention. Since the transistor $Q_3$ of the switching element 65 is connected in series to the signal lines 66, the drive current I can be completely controlled in the on-off mode. Thereby erroneous modulation can be prevented. According to the above-described embodiment, the circuitry is simple as shown in FIG. 3, and therefore the manufacturing cost of the semiconductor laser drive circuit 6 can be reduced as much.

If, in the above-described embodiment, an addition circuit 17 comprising registers $R_1$ and $R_2$ is interposed between the reference signal generating circuit 63 and the differential amplifier circuit 64 as shown in FIG. 6, then the sum Sr' of an adjusting signal VP for adjusting the output level of the laser beam LB and the signal Sr (Sr'=Sr+VP) can be effectively formed. Proper feedback paths are required around the operational amplifier OP.

In addition, the reference signal Sr can be automatically changed into Sr' according to the method in which, instead of the addition circuit 17, an electronic variable resistor 18 is employed as shown in FIG. 7 and the electronic variable resistor 18 is controlled with an adjusting control signal CP.

As is apparent from the above description, the semiconductor laser drive circuit according to the utility model can not only compensate the change of the output of the semiconductor laser due to the temperature characteristic and aging of the laser, but also prevent the semiconductor laser from damage due to overcurrent. Furthermore, the semiconductor laser drive circuit of the utility model can eliminate erroneous modulation, and can be manufactured at low cost.

What is claimed is:

1. In a laser beam printer for producing a copy of image data on a recording medium by scanning said medium with a laser beam modulated according to said image data, a semiconductor laser drive circuit comprising:

a semiconductor laser for outputting a laser beam;

a reference signal generating circuit having a temperature compensating element for compensating the temperature characteristic of said drive circuit including said semiconductor laser, said reference signal generating circuit outputting a reference signal which is corrected by said temperature compensating element;

a light receiving element for receiving a part of said laser beam outputted by said semiconductor laser and outputting a light reception signal according to the result of the light reception;

a sample and hold circuit for sampling said light reception signal outputted by said light receiving element for one of repeated scanning operations of said printer and holding said light reception signal thus sampled for said one scanning operation;

a differential amplifier circuit for applying a drive current to said semiconductor laser according to the difference between said light reception signal held by said sample and hold circuit and said reference signal outputted by said reference signal generating circuit; and a switching element connected in series with a signal line extending from an output of said differential amplifier circuit to an input of said semiconductor laser, said switching element being turned on and off by a modulation signal formed according to said image data, to intermittently permit the application of said drive current to said semiconductor laser.

2. A drive circuit as recited in claim 1, further comprising:

an optical detector disposed along a direction of said repeated scanning but outside a recording portion of said recording medium;

wherein said sample and hold circuit is triggered by a signal from said optical detector.

3. A drive circuit as recited in claim 1, wherein said sample and hold circuit includes integrating means for integrating said light reception signal.

4. A drive circuit as recited in claim 1, further comprising means for varying said reference signal.

5. A drive circuit as recited in claim 1, wherein said varying means comprising means for generating an addition signal and means for adding said reference signal and said addition signal to form a sum signal, said sum signal being applied to said differential amplifier circuit.

6. A drive circuit as recited in claim 1, wherein said varying means comprises a variable resistor connected in series between said reference signal generating circuit and said differential amplifier circuit.

7. A drive circuit, comprising a first transistor receiving a modulation signal on a control electrode, receiving an unmodulated drive current on a first principal electrode and outputting a modulated drive current on a second principal electrode;

a semiconductor laser receiving said modulated drive current for outputting a laser beam;

a photodetector closely coupled with said laser and receiving at least a part of said laser beam;

a second transistor receiving an output of said photodetector on a first principal electrode and pulsed sampling signal on its control electrode;

a capacitor connected between a reference potential and a second principal electrode of said second transistor;

means for producing a temperature compensating signal comprising a resistor and a temperature compensating element connected in series between two reference potentials, said temperature compensating signal being derived from a point serially connecting said resistor and said temperature compensating element;

a differential amplifier receiving on one of its inverting and non-inverting inputs said temperature compensating signal the other of said inputs being connected to said second principal electrode of said second transistor; and a third transistor having its principal electrodes resistively coupled between a reference potential and said first principal electrode of said first transistor and having its control electrode connected to an output of said differential amplifier for producing said unmodulated drive current.

8. A drive circuit as claimed in claim 7 wherein said temperature compensating element comprises a variable resistor, a temperature compensating diode, and a reference voltage generating Zener diode, the cathode of said temperature cnmpensating diode being connected to the cathode of said reference voltage generating Zener diode, and the anode of said temperature compensating diode being coupled to said variable resistor.

* * * * *